US012578504B2

(12) United States Patent
Segovia-Fernandez et al.

(10) Patent No.: US 12,578,504 B2
(45) Date of Patent: Mar. 17, 2026

(54) NARROWBAND SENSORS BASED ON PLASMONIC METASURFACES INTEGRATED ON PIEZOELECTRIC PLATES

(71) Applicant: TEXAS INSTRUMENTS INCORPORATED, Dallas, TX (US)

(72) Inventors: Jeronimo Segovia-Fernandez, San Jose, CA (US); Corina Nistorica, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 993 days.

(21) Appl. No.: 17/515,113

(22) Filed: Oct. 29, 2021

(65) Prior Publication Data

US 2023/0137953 A1     May 4, 2023

(51) Int. Cl.
G02B 1/00 (2006.01)
H10N 30/30 (2023.01)
H10N 30/50 (2023.01)
H10N 30/85 (2023.01)
H10N 30/87 (2023.01)

(52) U.S. Cl.
CPC ........... G02B 1/002 (2013.01); H10N 30/302 (2023.02); H10N 30/50 (2023.02); H10N 30/85 (2023.02); H10N 30/877 (2023.02)

(58) Field of Classification Search
CPC ...... G02B 1/002; G02B 5/008; H10N 30/302; H10N 30/50; H10N 30/85; H10N 30/877; H10N 30/304; H10N 30/853
See application file for complete search history.

(56) References Cited

U.S. PATENT DOCUMENTS

| | | | | |
|---|---|---|---|---|
| 11,092,870 B2* | 8/2021 | Tu | ........................... | H01Q 3/44 |
| 2006/0055488 A1* | 3/2006 | Ten Dolle | ............ | H03H 9/0028 |
| | | | | 333/190 |
| 2016/0099701 A1* | 4/2016 | Rinaldi | .................. | H03H 9/174 |
| | | | | 422/90 |
| 2019/0006136 A1* | 1/2019 | Rinaldi | .................. | H01H 37/10 |
| 2020/0212872 A1* | 7/2020 | Haroun | ............. | H03H 9/02015 |
| 2021/0296408 A1* | 9/2021 | Hong | ................... | A61B 5/6898 |
| 2021/0302308 A1* | 9/2021 | Segovia Fernandez | ..................... | |
| | | | | G01N 21/554 |
| 2023/0093121 A1* | 3/2023 | Abdulhalim | ...... | G02F 1/133504 |
| | | | | 349/16 |

* cited by examiner

*Primary Examiner* — Emily P Pham
(74) *Attorney, Agent, or Firm* — Zhenhai Fu; Frank D. Cimino

(57) ABSTRACT

An optical detector system includes a light source configured to emit light having a frequency spectrum and modulated in time, and an optical detector configured to detect an intensity of the light at a wavelength range within the frequency spectrum. The optical detector includes a piezoelectric layer, a first metal layer coupled to a first surface of the piezoelectric layer, a second metal layer coupled to a second surface of the piezoelectric layer, and a plasmonic metasurface coupled to the first metal layer and configured to absorb the light at the wavelength range, the plasmonic metasurface including metal structures and a dielectric layer disposed on the first metal layer. The optical detector system further includes a voltage detector coupled to the first metal layer and the second metal layer, the voltage detector configured to detect a voltage at a frequency of the modulated light.

21 Claims, 9 Drawing Sheets

1500

1501 — MODULATE IN TIME LIGHT EMITTED FROM A LIGHT SOURCE HAVING A FREQUENCY SPECTRUM

1502 — ABSORB, AT ONE OR MORE METASURFACES OF A LIGHT DETECTOR, THE LIGHT FROM THE LIGHT SOURCE AT ONE OR MORE RESPECTIVE RESONANCE WAVELENGTHS OF THE METASURFACES

1503 — MEASURE AN AMPLITUDE OF A VOLTAGE ACROSS A PIEZOELECTRIC LAYER OF THE LIGHT DETECTOR

1504 — DETERMINE AN AMPLITUDE OF THE VOLTAGE AND A CORRESPONDING CHANGE IN THE INTENSITY OF THE INCIDENT LIGHT

FIG. 15

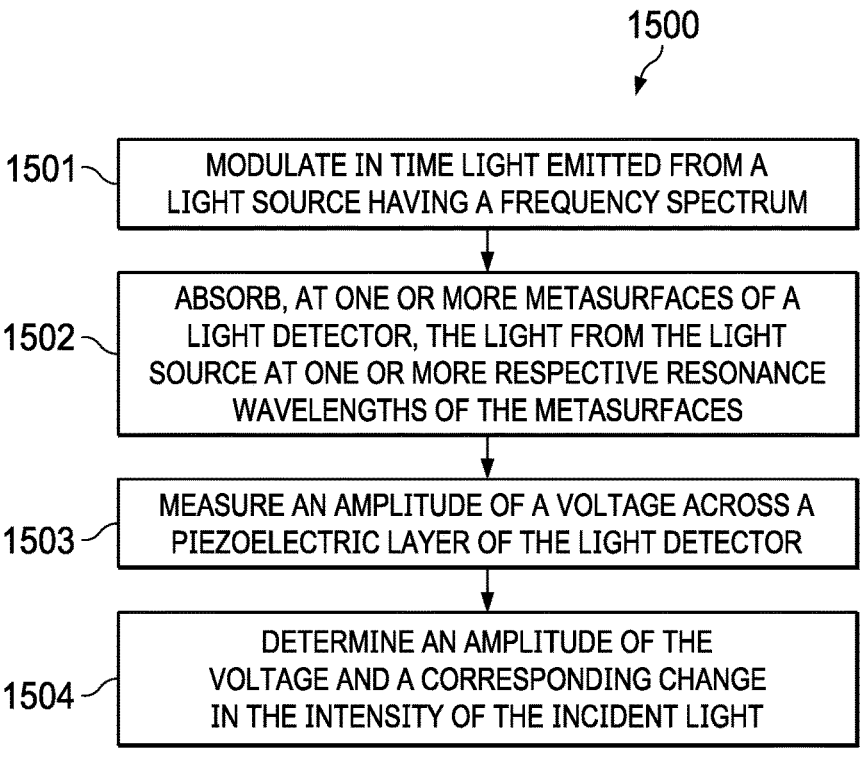

1600

1604

PROCESSOR
1601

TRANSCEIVER
1603

MEMORY   1602

INSTRUCTIONS
1606

NARROWBAND SENSORS BASED ON PLASMONIC METASURFACES INTEGRATED ON PIEZOELECTRIC PLATES

BACKGROUND

A metasurface is an artificially made material, also referred to as a metamaterial, that includes structures of symmetrically arranged geometric patterns having sub-wavelength dimensions with respect to a portion of the electromagnetic spectrum. A plasmonic metasurface is a type of metasurface that exhibits negative real permittivity and, under conditions of electromagnetic excitation, can create surface charge-density oscillations known as surface plasmon-polaritons (SPPs). Plasmonic metasurfaces are formed by metals or metal-like materials, such as a combination of metallic and dielectric materials, and contain subwavelength-scaled structures that are distributed on or under the surface. The structures may have similar or different geometries and may be repeated and spaced across a layer to alter the behavior of electromagnetic waves, thereby generating the SPPs. For example, the structures may be separated circular, square or cross-like metal patches that are placed on a dielectric layer. A plasmonic metasurface can be designed to interact with an electromagnetic wave in a certain light spectrum, such as visible or infrared (IR) light, to absorb or reflect light at a certain wavelength or frequency.

SUMMARY

In accordance with at least one example of the description, an apparatus includes a first metal layer, a piezoelectric layer on the first metal layer, a second metal layer on the piezoelectric layer, a plasmonic metasurface on the second metal layer, the plasmonic metasurface including a dielectric layer and metal structures, and the apparatus further including a voltage detector coupled to the first metal layer and the second metal layer.

In accordance with another example of the description, an optical device includes a plasmonic metasurface configured to absorb an incident light having a frequency spectrum and modulated in time, a first metal layer coupled to the plasmonic metasurface, a piezoelectric layer coupled to the first metal layer, a second metal layer coupled to the plasmonic metasurface, and a voltage detector coupled to the first metal layer and second metal layer, the voltage detector configured to detect an amplitude of an electrical signal modulated in time according to the modulated incident light.

In accordance with another example of the description, an optical detector system includes a light source configured to emit light having a frequency spectrum and modulated in time, and an optical detector configured to detect an intensity of the light at a wavelength range within the frequency spectrum, the optical detector including a piezoelectric layer, a first metal layer coupled to a first surface of the piezoelectric layer, a second metal layer coupled to a second surface of the piezoelectric layer, a plasmonic metasurface coupled to the first metal layer and configured to absorb the light at the wavelength range, the plasmonic metasurface including metal structures and a dielectric layer disposed on the first metal layer, and the optical detector system further including a voltage detector coupled to the first metal layer and the second metal layer, the voltage detector configured to detect a voltage at a frequency of the modulated light.

BRIEF DESCRIPTION OF THE DRAWINGS

FIG. 15 is a flow diagram of a method for light detection in an optical detector system, in accordance with various examples.

FIG. 16 is a block diagram of a hardware architecture for processing signal data, in accordance with various examples.

DETAILED DESCRIPTION

Figure 1:
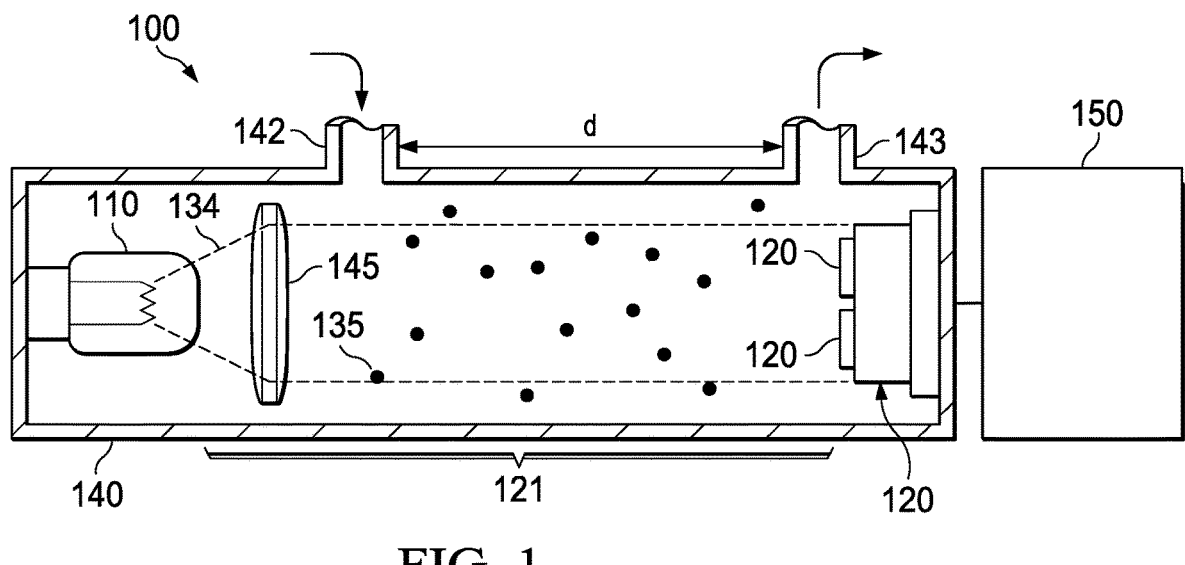
FIG. 1 is a block diagram of a light detector system, in accordance with various examples.

Optical detectors, which may also be referred to as light detectors, are types of devices that detect light at a specific frequency or wavelength range. The detection includes absorbing a portion of light radiation that illuminates a surface of the detector and converting it into a signal, such as an electrical signal, which can be measured and analyzed. Light that illuminates or is projected onto a surface may also be referred to as incident light. Analysis of the measured electrical signal is useful to infer the characteristics of a sample exposed to the light radiation. The characteristics of the sample may include the type, composition, or density of substances in the sample. For example, optical detectors can be useful as gas or fluid detectors with one or more light sources having a frequency spectrum, such as infrared, visible light, or ultraviolet laser sources. Optical detectors may include various materials and layers designed for specific detection applications.

An optical detector may include a plasmonic metasurface that is engineered according to the application. This may involve the plasmonic metasurface achieving a peak in absorption at a wavelength of light and substantially low or no absorption away from that wavelength. Such response is referred to as a resonance response, and the wavelength at the peak absorption is referred to as the resonance wavelength. The resonance response may provide a filtering effect of the incident light where light may be absorbed within a relatively narrow wavelength range with respect to the frequency spectrum of the emitted light. Plasmonic metasurface design includes determining the spacing and size of structures dispersed across the plasmonic metasurface, for instance in the form of a two-dimensional (2D) array. To achieve detection, the plasmonic metasurface may be combined with other materials and layers that are stacked over one another and anchored with low thermal coupling to a base, such as a silicon (Si) substrate or other form of substrate.

Responsive to projecting incident light on the plasmonic metasurface, the incident light radiation may interact with the plasmonic metasurface causing energy oscillation at the surface. The energy oscillation may be referred to as a plasmon. The energy generated at the plasmonic metasurface which undergoes the plasmon effect can propagate into sublayers in the detector and is useful for detection. The metamaterial may be coupled to a piezoelectric layer and metal layers on the substrate. The piezoelectric layer is an active layer that expands or contracts, responsive to absorbing the light radiation from the plasmonic metasurface, and converts the thermally-induced deformation into an electric signal.

The description provides various examples of combining plasmonic metasurfaces with a piezoelectric layer in an optical detector. The combination may provide for light detection with multi-sensor capability which is useful for characterizing multiple samples. The various examples of the optical detector design may detect multiple gas concentrations in a medium with a broadband light source. The design can have a compact form factor, and therefore may have a reduced cost and energy consumption in comparison to other approaches. The optical detector may include multiple plasmonic metasurfaces disposed on a piezoelectric layer and metal layers. Each plasmonic metasurface on the piezoelectric layer may operate as a sensor unit in the optical detector and may be designed for absorbing a broadband incident light at a corresponding resonance wavelength. The optical detector may also include contacts that anchor each sensor unit to the surrounding components in the optical detector package. The anchor contacts may provide structural support with limited thermal coupling of the sensor units.

The broadband light from the light source, which may have an IR or visible frequency spectrum, may be modulated at a certain frequency within the spectrum. The modulated light may be absorbed by the optical detector, and cause the piezoelectric layer to contract and expand periodically in time due to light modulation. Light energy absorption in the piezoelectric layer may provide an electric signal which may be measured in the form of voltage. The amplitude of the measured voltage may be proportional to the amount of absorbed light at the resonance wavelength of each plasmonic metasurface of a sensor unit in the optical detector.

The sensor units can be coupled in parallel through respective transimpedance amplifier circuits, and a multi-plexer may couple the amplifier circuits to a processor to enable analyzing the voltage at the piezoelectric layer. The analysis may be based on the relation between the voltage amplitude detected from the piezoelectric layer and the temperature reached by the piezoelectric layer caused by light absorption. Thus, the detected voltage level can be linked to the amplitude of the incident light that is absorbed by the optical detector, and a change of measured voltage can be correlated with a change of temperature and therefore light amplitude. The change in light amplitude at the optical detector can be attributed to a characteristic of the sample, such as volume or concentration of a gas, exposed to the light before absorption. Further, the voltage to temperature sensitivity can be increased by adding more anchor contacts to the sensor units, as described below.

FIG. 1 is a block diagram of a light detector system 100, in accordance with various examples. The light detector system 100 may include a light source 110 and an optical detector 120 separated by a space 121. The light source 110 may be any light emitting device that emits a light beam 134 directed toward the optical detector 120. For example, the light source 110 may be a laser that emits the light beam 134 in the visible spectrum or the infrared (IR) spectrum. The optical detector 120 may be positioned in front of the light source 110 to detect at least a portion of the emitted light beam 134 that is incident on the surface of the optical detector 120. The optical detector 120 may be designed to absorb a portion of the light beam 134 within a wavelength or frequency range which falls in the light spectrum of the light source 110. The intensity or amplitude of the absorbed portion of the light beam 134 may be detected by the optical detector 120. The components of the optical detector 120 may be encased in a package to protect the optical detector 120.

A sample 135 to be analyzed may be disposed in the space 121 between the light source 110 and the optical detector 120 such that the sample 135 is exposed to the light beam 134. The absorbed portion of the light beam 134 may be collected at the optical detector 120 and converted into an electric signal, such as a voltage, which may be measured and analyzed to infer characteristics of the sample 135. For example, the sample 135 may be a fluid, a gas, or multiple gases. The characteristics of the sample 135 may include the chemical composition, density, concentration, or molecular size of the sample 135. The light detector system 100 may also include a chamber 140 for holding or containing the sample 135. The chamber 140 may include openings in front of the light source 110 and the optical detector 120 to allow the passing of the light beam 134 from the light source 110 to the optical detector 120 through the chamber 140. In an example, the chamber 140 may include a first opening 142 and a second opening 143, separated by a distance (d). The first opening 142 may be an inlet for injecting the sample 135 into the chamber 140, and the second opening 143 may be an outlet for releasing the sample 135 from the chamber 140. The chamber 140 may include a lens 145 for aligning and projecting the light beam 134 toward the optical detector 120.

The light detector system 100 may also include a processing system 150 electrically coupled to the optical detector 120. The processing system 150 may receive electrical signals from the optical detector 120, responsive to the optical detector 120 absorbing a portion of the light beam 134 from the light source 110. The electrical signals may be measured, such as via a voltage detector, and analyzed to determine the characteristics of the sample 135. The processing system 150 may include a processor (not shown) for processing the electrical signals based on stored data or models for characterizing the sample 135. For example, the processing system 150 may be a computer system including a processing chip (not shown) and a storage medium (not shown).

Figure 2:
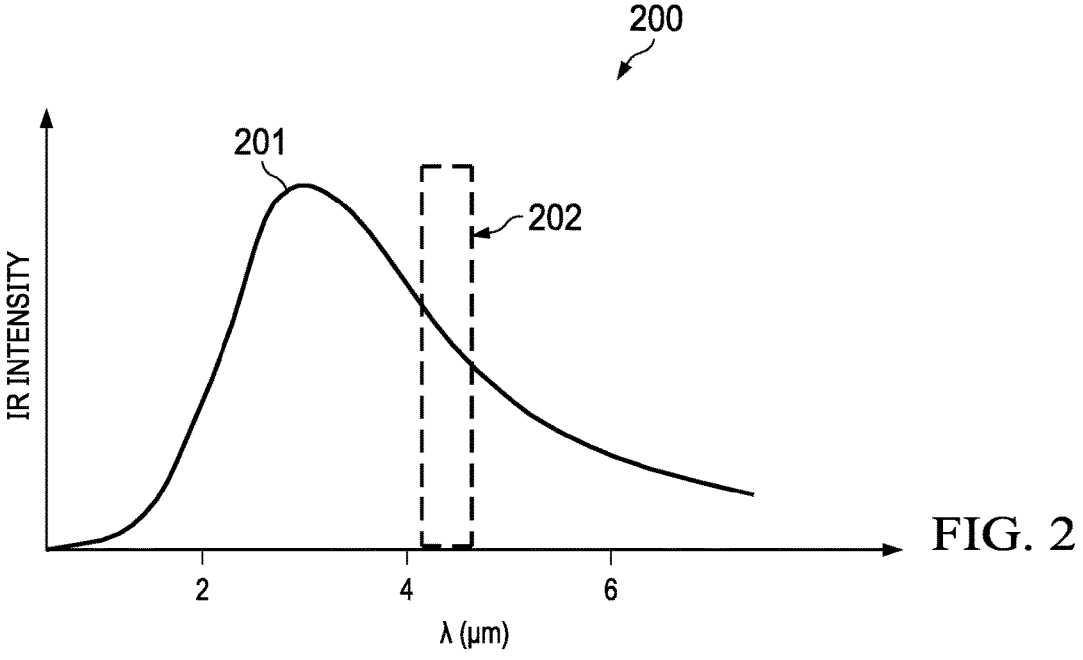
FIG. 2 is a graph of light intensity of emitted light in the light detector system of FIG. 1, in accordance with various examples.

FIG. 2 is a graph 200 of light intensity of emitted light in the light detector system 100, in accordance with various examples. In the graph 200, the x-axis represents a range of wavelengths of the emitted light in micrometers (μm) and the y-axis represents a relative scale of the power values of the emitted light beam 134 by the light source 110. The wavelength range of the x-axis is between approximately 1 and 7 μm, which may be part of the IR spectrum. The light intensity is represented by a curve 201 and corresponds to the radiation power of the light beam 134 emitted by the light source 110 in the IR spectrum. The wavelength range may overlap at least partially with a wavelength region 202 centered at approximately the resonance wavelength (at approximately 4.5 μm) of a plasmonic metasurface in the optical detector 120. Accordingly, the optical detector 120 may absorb a portion of the light beam 134 that is useful for detection of the light in the wavelength region 202.

Figure 3:
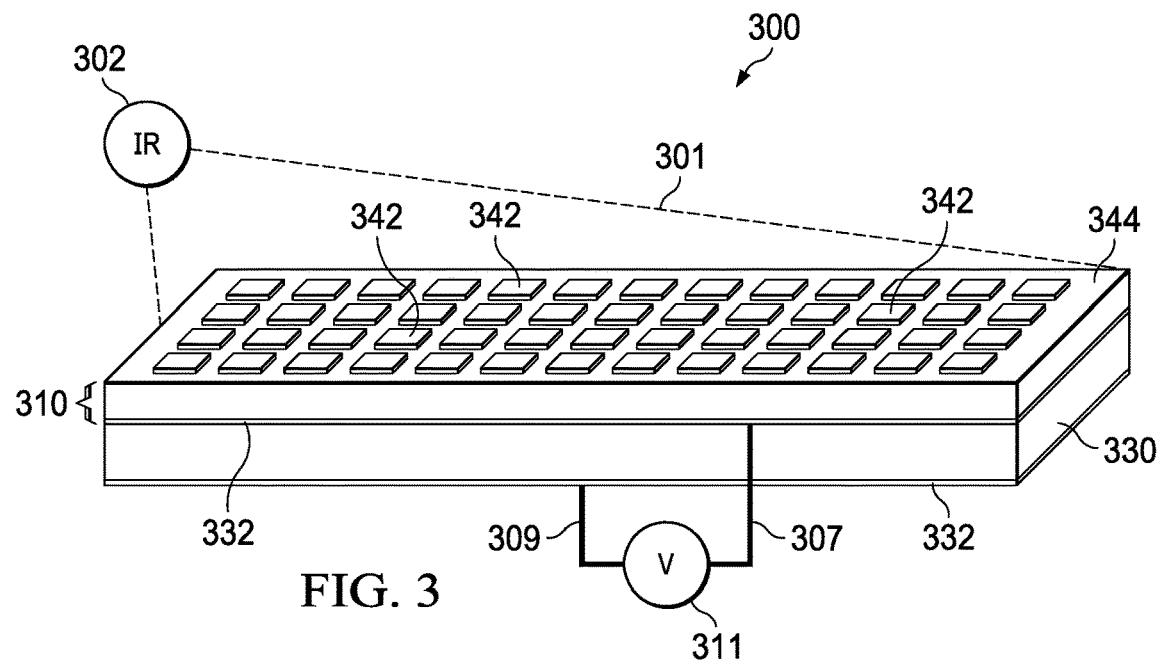
FIG. 3 is a diagram of an optical device, in accordance with various examples.

FIG. 3 is a diagram of an optical device 300, in accordance with various examples. The optical device 300 may be a light sensing device capable of absorbing incident light 301 on a surface of the optical device 300. Absorbing a portion of the incident light 301 may be useful for detecting the intensity or amplitude of the incident light 301 in the wavelength region 202. For example, the optical device 300 may be part of the optical detector 120 and may provide an electrical signal responsive to absorbing a portion of the incident light 301. The incident light 301 may be emitted from a light source 302 having a frequency spectrum in the IR region, such as the light source 110 which emits the light beam 134. The amplitude of the incident light 301 in the IR spectrum may also be modulated in time by varying the power of the light source 302 between different power levels according to a time wave pattern or by switching the light source 302 on and off periodically in time.

The optical device 300 may include multiple layers and materials designed to increase the absorbed amount or portion of the incident light 301 within a certain wavelength range. Increasing the amount of absorbed light may increase the signal-to-noise ratio in a light detection system and therefore allow for more accurate detection results. The optical device 300 may include a patched metal layer as a plasmonic metasurface 310, a piezoelectric layer 330, a first metal layer 332 between the plasmonic metasurface 310 and the piezoelectric layer 330, and a second metal layer 332 under the piezoelectric layer 330.

The plasmonic metasurface 310 may include a one-dimensional (1D) or 2D array of structures 342 disposed on or in a dielectric layer 344. For example, the structures 342 may correspond to a grid of metal patches equally spaced on the dielectric layer 344. In another example, the plasmonic metasurface 310 may include a grid of equally spaced gaps in a metal layer (not shown). The gaps may be empty gaps or may be filled with a dielectric or other material or a combination thereof. The structures 342 may have various geometric patterns, sizes, and spacing. For example, the geometric patterns may include square, round, slit, or cross patterns. The spacing of the structures 342 may determine the resonance response of the plasmonic metasurface 310 responsive to absorbing a portion of the incident light 301 at a wavelength range narrower than the IR spectrum. The dielectric layer 344 may include a dielectric material transparent to the incident light 301 in at least a portion of the IR spectrum. For example, the dielectric layer 344 may be a silicon oxide (SiO$_2$) layer or any other suitable dielectric material.

The piezoelectric layer 330 may be formed from a piezoelectric material. An example of a piezoelectric material is a crystal material capable of converting mechanical energy into electrical energy. For example, the piezoelectric layer 330 may be an aluminum nitride (AlN) layer and the first and second metal layers 332 may be molybdenum (Mo) layers. The piezoelectric layer 330 may deform in the contour or thickness directions responsive to absorbing the light energy from the plasmonic metasurface 310, which may provide heat energy in the piezoelectric layer 330. The heat energy may be converted by the piezoelectric layer 330 into electric energy. The electric energy may be collected by coupling electrodes 307 and 309 to the first and second metal layers 332, respectively. The transferred electric energy may be measured as an electrical signal, such as a voltage 311. For example, the electrodes 307 and 309 may be coupled to the first metal layer 332 between the plasmonic metasurface 310 and the piezoelectric layer 330, and to the second metal 332 under the piezoelectric layer 330. The optical device 300 may also include contacts (not shown) that anchor the plasmonic metasurface 310, the metal layer 320, and the piezoelectric layer 330 to the surrounding substrate in a component package that includes or encases the optical device 300. The anchor contacts may provide structural support for the layers of the optical device and may work as signal routers to connect the first and second metal layers 332 to the coupling electrodes 307 and 309.

Figure 4:
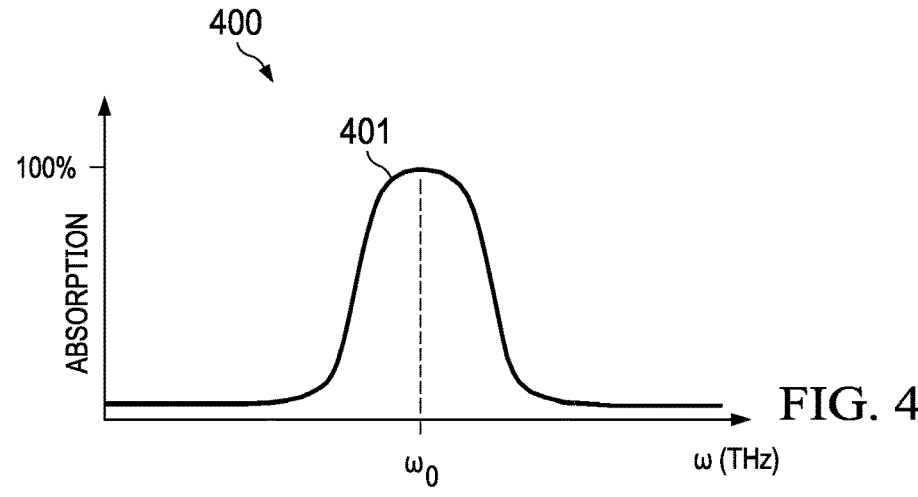
FIG. 4 is a graph of absorption of incident light on the optical device of FIG. 3, in accordance with various examples.

FIG. 4 is a graph 400 of absorption of incident light 301 on the optical device 300, in accordance with various examples. In the graph 400, the x-axis represents a frequency range of the incident light 301 and the y-axis represents the absorption values of incident light 301. The absorption values reflect the amplitude of the absorbed light at the plasmonic metasurface 310 as a percentage. The frequency range of the x-axis is represented in terahertz (THz), which corresponds to the IR spectrum. The light absorption is represented by a curve 401 that shows percentages of the absorbed light at the plasmonic metasurface 310 within the frequency range. The frequency range of light absorption may include a resonance frequency ($\omega_0$) of the plasmonic metasurface 310. The absorbed light in this frequency range may be converted via the piezoelectric layer 330 into electric energy which can be measured as a voltage 311.

Figure 5:
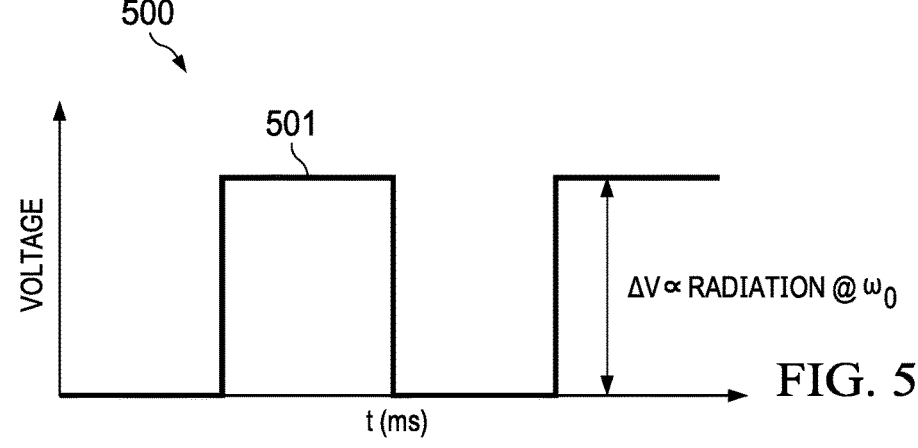
FIG. 5 is a graph of measured voltage responsive to incident light on the optical device of FIG. 3, in accordance with various examples.

FIG. 5 is a graph 500 of measured voltage responsive to incident light 301 on the optical device 300, in accordance with various examples. In some examples, the voltage 311 is measured at the piezoelectric layer 330. In the graph 500, the x-axis represents time in units of milliseconds (ms) and the y-axis represents a relative scale of the amplitude values of the measured voltage in units of volts (V). The measured voltage is represented by a modulated voltage signal 501 that includes the voltage values over a time range. The modulated voltage signal 501 may be measured responsive to absorbing, at the plasmonic metasurface 310, the incident light 301, which may be modulated in time. Accordingly, the modulated voltage signal 501 may vary periodically in time between two values having a voltage difference (ΔV) proportional to the amplitude value of the absorbed light at w$_0$, as described above with respect to FIG. 4.

Figures 6A, 6B:
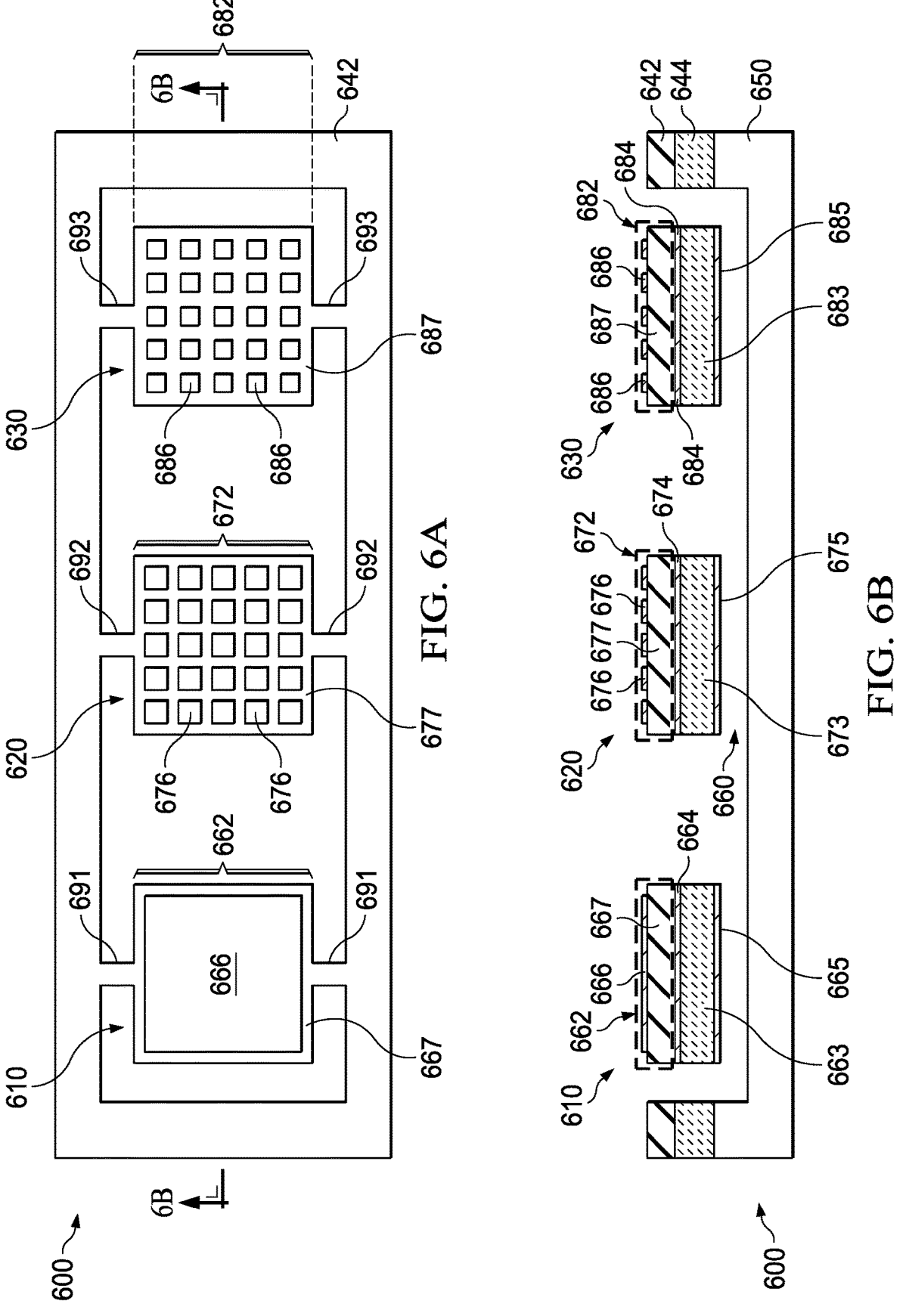
FIG. 6A is a diagram showing a top view of an optical device including multiple sensor units, in accordance with various examples.
FIG. 6B is a diagram showing a cross section view of the optical device of FIG. 6A, in accordance with various examples.

FIGS. 6A and 6B show a top view and a cross section view, respectively, of an optical device 600 including multiple sensor units, in accordance with various examples. The optical device 600 may include a reference sensor unit 610, a first sensor unit 620, a second sensor unit 630, and a first surrounding surface 642 on a second surrounding surface 644, which is disposed on a substrate 650. The reference sensor unit 610, the first sensor unit 620 and the second sensor unit 630 may be separated by a gap 660 from the substrate 650. The gap 660 may provide thermal isolation between the reference sensor unit 610, the first sensor unit 620, the second sensor unit 630, and the substrate 650.

Each one of the reference sensor unit 610, the first sensor unit 620, and the second sensor unit 630 may correspond to a separate surface of the optical device 600. The reference sensor unit 610, first sensor unit 620, and second sensor unit 630 enable the optical device 600 to absorb incident light 301 on the surface of the optical device 300 at multiple frequency or wavelength ranges, each corresponding to one of the reference sensor unit 610, first sensor unit 620, and second sensor unit 630. For example, the light beam 134 may be emitted from the light source 110 having a frequency spectrum in the IR region and may be modulated in time by varying the power of the light source 110. The optical device 600 may be part of the optical detector 120 and may provide an electrical signal responsive to the optical device 600 absorbing the portion of the light beam 134 at the multiple wavelength ranges.

The reference sensor unit 610, the first sensor unit 620, and the second sensor unit 630 may have a rectangle or square surface geometry. In other examples, the reference sensor unit 610, the first sensor unit 620, and the second sensor unit 630 may have other surface geometries. The reference sensor unit 610 may include a reference sensor unit surface 662, a reference sensor unit piezoelectric layer 663, a first reference sensor unit metal layer 664 between the reference sensor unit surface 662 and the reference sensor unit piezoelectric layer 663, and a second reference sensor unit metal layer 665 on the gap 660 facing surface of the reference sensor unit piezoelectric layer 663. The reference sensor unit surface 662 may include a uniform metal surface 666 on a reference sensor unit dielectric layer 667. The first sensor unit 620 may include a first plasmonic metasurface 672, a first sensor unit piezoelectric layer 673, a first sensor unit first metal layer 674 between the first plasmonic metasurface 672 and the first sensor unit piezoelectric layer 673, and a first sensor unit second metal layer 675 on the gap 660 facing surface of the first sensor unit piezoelectric layer 673. The first plasmonic metasurface 672 may include a first 2D array of first structures 676 on a first sensor unit dielectric layer 677. The second sensor unit 630 may include a second plasmonic metasurface 682, a second sensor unit piezoelectric layer 683, a second sensor unit first metal layer 684 between the second plasmonic metasurface 682 and the second sensor unit piezoelectric layer 683, and a second sensor unit second metal layer 685 on the gap 660 facing surface of the second sensor unit piezoelectric layer 683. The second plasmonic metasurface 682 may include a second 2D array of second structures 686 on a second sensor unit dielectric layer 687. The first structures 676 and second structures 686 may have patterns of various geometries and sizes. For example, the first structures 676 and second structures 686 may be square patches. The spacing between the patches of the first structures 676 and second structures 686 may be different, causing a different resonance response and resonance frequency for absorbing the incident light 301 in the IR spectrum.

The uniform metal surface 666 of the reference sensor unit 610 may not have a resonance response for absorbing the incident light 301 around a resonance frequency, and may have lower absorption than the first plasmonic metasurface 672 of the first sensor unit 620 and the second plasmonic metasurface 682 of the second sensor unit 630. Therefore, the reference sensor unit 610 may be useful to detect a base absorption level of incident light 301 as a reference level to the absorption levels of the first sensor unit 620 and the second sensor unit 630.

The first surrounding surface 642, the reference sensor unit dielectric layer 667, the first sensor unit dielectric layer 677, and the second sensor unit dielectric layer 687 may include the same dielectric layer. The second surrounding surface 644, the reference sensor unit piezoelectric layer 663, the first sensor unit piezoelectric layer 673, and the second sensor unit piezoelectric layer 683 may include the same piezoelectric layer. The reference sensor unit 610, the first sensor unit 620, and the second sensor unit 630 may be separated from the first surrounding surface 642, and second surrounding surface 644 on the substrate 650 by gaps 660 etched in the layers of the optical device 600. This separation may provide thermal isolation between the reference sensor unit 610, the first sensor unit 620, the second sensor unit 630, and the surrounding components and layers on the substrate 650.

The reference sensor unit 610 may be anchored to the first surrounding surface 642 and the second surrounding surface 644 through two contacts 691 on opposite sides of the reference sensor unit 610. The contacts 691 may be composed of the reference sensor unit dielectric layer 667 and the reference sensor unit piezoelectric layer 663, which extend from the reference sensor unit 610 to the first surrounding surface 642 and the second surrounding surface 644. Similarly, the first sensor unit 620 may be anchored to the first surrounding surface 642 and the second surrounding surface 644 through two contacts 692 on opposite sides of the first sensor unit 620. The contacts 692 may be composed of the first sensor unit dielectric layer 677 and the first sensor unit piezoelectric layer 673, which extend from the first sensor unit 620 to the first surrounding surface 642 and the second surrounding surface 644. The second sensor unit 630 may be anchored to the first surrounding surface 642 and the second surrounding surface 644 through two contacts 693 on opposite sides of the second sensor unit 630. The contacts 693 may be composed of the second sensor unit dielectric layer 687 and the second sensor unit piezoelectric layer 683, which extend from the second sensor unit 630 to the first surrounding surface 642 and the second surrounding surface 644.

Figures 7A, 7B:
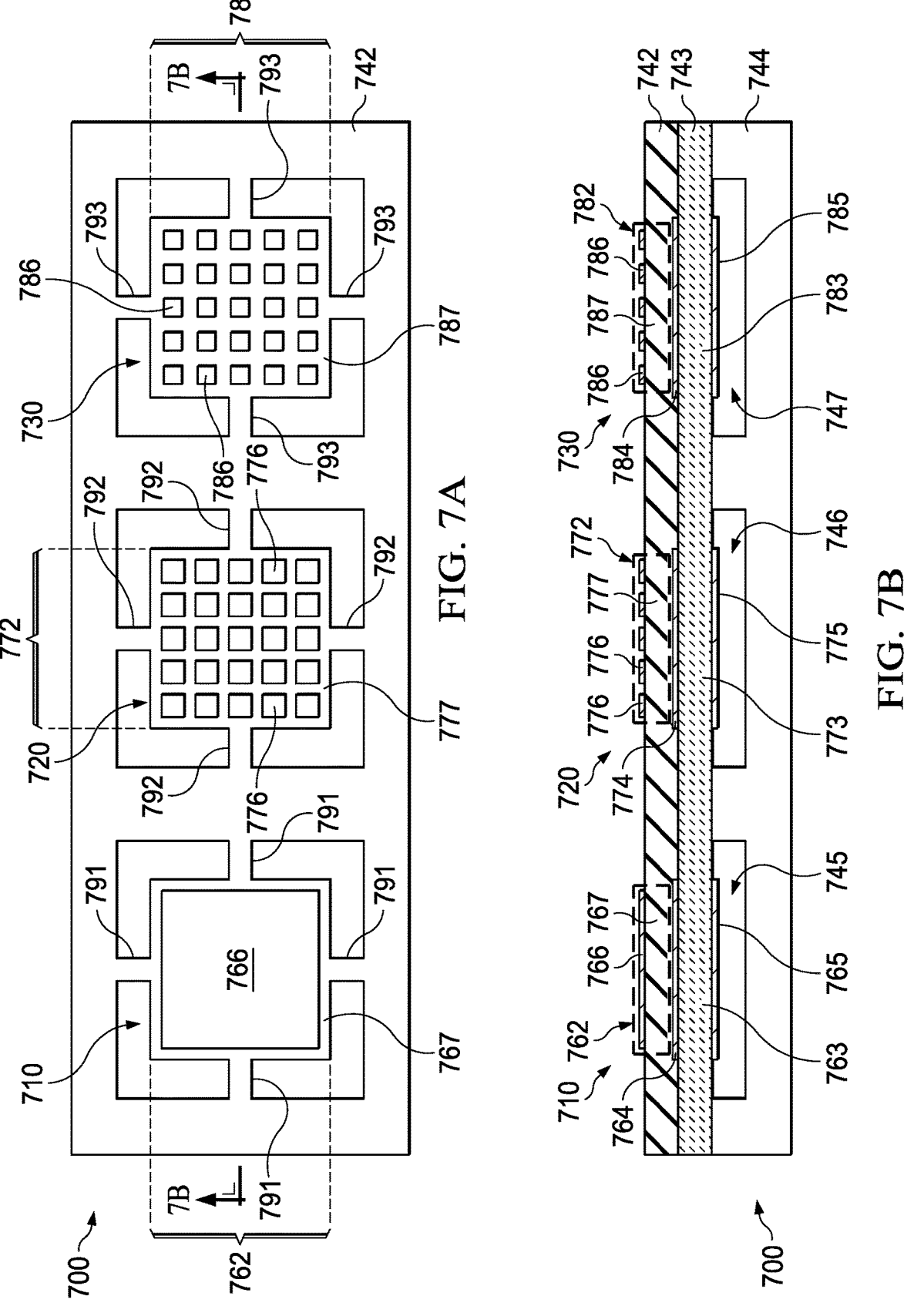
FIG. 7A is a diagram showing a top view of an optical device including multiple sensor units, in accordance with various examples.
FIG. 7B is a diagram showing a cross section view of the optical device of FIG. 7A, in accordance with various examples.

FIGS. 7A and 7B show a top view and a cross section view, respectively, of an optical device 700 that includes multiple sensor units, in accordance with various examples. The sensor units may correspond to separate surfaces which enable the optical device 700 to absorb incident light on the surface of the optical device 700 at multiple frequency or wavelength ranges. For example, the optical device 700 may be part of the optical detector 120 and may provide an electrical signal responsive to the optical device 700 absorbing the incident light 301 at the multiple wavelength ranges. The incident light 301 may be a portion of the light beam 134 emitted from the light source 110 having a frequency spectrum in the IR region and may be modulated in time by varying the power of the light source 110.

The optical device 700 may include multiple layers and materials similar to the optical device 600. The optical device 700 may include a reference sensor unit 710, a first sensor unit 720, a second sensor unit 730, and a first surrounding surface 742 on a second surrounding surface 743, which is disposed on a substrate 744. As shown in FIGS. 7A and 7B, the reference sensor unit 710, the first sensor unit 720, and the second sensor unit 730 are separated by a first surrounding surface 742 and a second surrounding surface 743. The reference sensor unit 710, the first sensor unit 720, and the second sensor unit 730 may also be separated by respective gaps 745, 746, and 747 from the substrate 744. The gaps 745, 746, and 747 may provide thermal isolation between the reference sensor unit 710, the first sensor unit 720, the second sensor unit 730, and the substrate 744.

The reference sensor unit 710, the first sensor unit 720, and the second sensor unit 730 may have a rectangle or square surface geometry. In other examples, the sensor units may have other surface geometries. The reference sensor unit 710 may include a reference sensor unit surface 762, a reference sensor unit piezoelectric layer 763, a first reference sensor unit metal layer 764 between the reference sensor unit surface 762 and the reference sensor unit piezoelectric layer 763, and a second reference sensor unit metal layer 765 on the gap 745 facing surface of the reference sensor unit piezoelectric layer 763. The reference sensor unit surface 762 may include a uniform metal surface 766 on a reference sensor unit dielectric layer 767. The first sensor unit 720 may include a first plasmonic metasurface 772, a first sensor unit piezoelectric layer 773, a first sensor unit first metal layer 774 between the first plasmonic metasurface 772 and the first sensor unit piezoelectric layer 773, and a first sensor unit second metal layer 775 on the gap 746 facing surface of the first sensor unit piezoelectric layer 773. The first plasmonic metasurface 772 may include a first 2D array of first structures 776 on a first sensor unit dielectric layer 777. The second sensor unit 730 may include a second plasmonic metasurface 782, a second sensor unit piezoelectric layer 783, a second sensor unit first metal layer 784 between the second plasmonic metasurface 782 and the second sensor unit piezoelectric layer 783, and a second sensor unit second metal layer 785 on the gap 747 facing surface of the second sensor unit piezoelectric layer 783. The second plasmonic metasurface 782 may include a second 2D array of second structures 786 on a second sensor unit dielectric layer 787. The first structures 776 and second structures 786 may have patterns of various geometries and sizes. For example, the first structures 776 and second structures 786 may be square patches. The spacing between the patches in first structures 776 and second structures 786 may be different, causing a different resonance response and resonance frequency for absorbing the incident light 301 in the IR spectrum.

The uniform metal surface 766 of the reference sensor unit 710 may not have a resonance response for absorbing the incident light 301 around a resonance frequency, and may have lower absorption than the first plasmonic metasurface 772 of the first sensor unit 720 and the second plasmonic metasurface 782 of the second sensor unit 730. Therefore, the reference sensor unit 710 may be useful to detect a base absorption level of incident light 301 as a reference level to the absorption levels of the first sensor unit 720 and the second sensor unit 730.

The first surrounding surface 742, the reference sensor unit dielectric layer 767, the first sensor unit dielectric layer 777, and the second sensor unit dielectric layer 787 may be composed of the same dielectric layer. The second surrounding surface 743, the reference sensor unit piezoelectric layer 763, the first sensor unit piezoelectric layer 773, and the second sensor unit piezoelectric layer 783 may be a same (e.g., contiguous) piezoelectric layer. As shown in FIG. 7A, the sides of the reference sensor unit 710, the first sensor unit 720, and the second sensor unit 730 may be separated from the first surrounding surface 742 and second surrounding surface 743 by gaps 745, 746, and 747 etched in the layers of the optical device 700, which may provide thermal isolation between the reference sensor unit 710, the first sensor unit 720, the second sensor unit 730, and the surrounding components and layers on the substrate 744.

Each of the reference sensor unit 710, the first sensor unit 720, and the second sensor unit 730 in the optical device 700 may be anchored by four contacts on four sides of the sensor units. The reference sensor unit 710 may be anchored to the first surrounding surface 742 and the second surrounding surface 743 through four contacts 791 on four sides of the reference sensor unit 710. The contacts 791 may include the reference sensor unit dielectric layer 767 and the reference sensor unit piezoelectric layer 763, which extend from the reference sensor unit 710 to the first surrounding surface 742 and the second surrounding surface 743. Similarly, the first sensor unit 720 may be anchored to the first surrounding surface 742 and the second surrounding surface 743 through four contacts 792 on four sides of the first sensor unit 720. The contacts 792 may include the first sensor unit dielectric layer 777 and the first sensor unit piezoelectric layer 773, which extend from the first sensor unit 720 to the first surrounding surface 742 and the second surrounding surface 743. The second sensor unit 730 may also be anchored to the first surrounding surface 742 and the second surrounding surface 743 through four contacts 793 on four sides of the second sensor unit 730. The contacts 793 may include the second sensor unit dielectric layer 787 and the second sensor unit piezoelectric layer 783, which extend from the second sensor unit 730 to the first surrounding surface 742 and the second surrounding surface 743.

Figure 8:
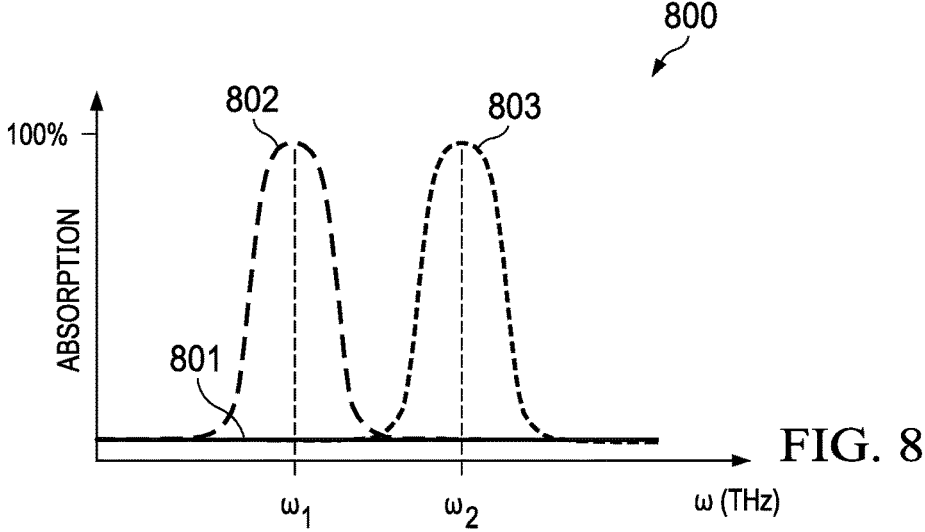
FIG. 8 is a graph of absorption of incident light on an optical device including multiple sensor units, in accordance with various examples.

FIG. 8 is a graph 800 of absorption of incident light on an optical device including multiple sensor units, such as the optical device 600 or the optical device 700, in accordance with various examples. In FIG. 8, the x-axis represents a frequency range of the incident light and the y-axis represents the absorption values of incident light. The absorption values reflect the amplitude of the absorbed light at the sensor units of the optical device as a percentage. The frequency range of the x-axis is represented in THz, which corresponds to the IR spectrum. The sensor units of the optical device may include a reference sensor unit, a first plasmonic metasurface and a second plasmonic metasurface. For example, the sensor units may correspond to the reference sensor unit 610, the first sensor unit 620, and the second sensor unit 630, or may correspond to the reference sensor unit 710, the first sensor unit 720, and the second sensor unit 730. The light absorption is represented by the curves 801, 802, and 803 that show percentages of the absorbed light at the surfaces of the reference sensor unit, the first plasmonic metasurface, and the second plasmonic metasurface, respectively.

The curve 801 shows an absence of a peak in absorption in the frequency range, which may be caused by the absence of a resonance response for light absorption at the reference sensor unit of the optical device. The curve 802 shows a peak in absorption in the frequency range at a first resonance frequency ($\omega_1$) of the first plasmonic metasurface of the optical device. The curve 803 shows a second peak in absorption in the frequency range at a second resonance frequency ($\omega_2$) of the second plasmonic metasurface of the optical device. The first and second resonance frequencies may be useful for detecting two samples with a broadband IR light source. The peaks in absorptions in the curves 802 and 803 of the first and second plasmonic metasurfaces may be at approximately equal amplitude percentages (as shown in FIG. 8) or may be at different amplitude levels above the reference level in curve 801. The absorption percentages in the curve 801 may be useful as a reference level for light absorption compared to the absorption percentages in the curves 802 and 803. Because the measured voltages responsive to light absorption at the reference sensor unit 610 or 710, the first sensor unit 620 or 720, and the second sensor unit 630 or 730 in the optical device 600 or 700 may be proportional to light absorption at the sensor units, the measured voltage for the reference sensor unit 610 or 710 may also be used as a base voltage level to the measured voltages for the first sensor unit 620 or 720 and second sensor unit 630 or 730. Accordingly, a relative voltage value may be calculated for each of the first sensor unit 620 or 720 and the second sensor unit 630 or 730 with respect to the measured base voltage for the reference sensor unit 610 or 710. The relative voltage values may be useful to quantify the respective amount of light absorption at the first plasmonic metasurface 672 or 772 and the second plasmonic metasurface 682 or 782.

Figure 9:
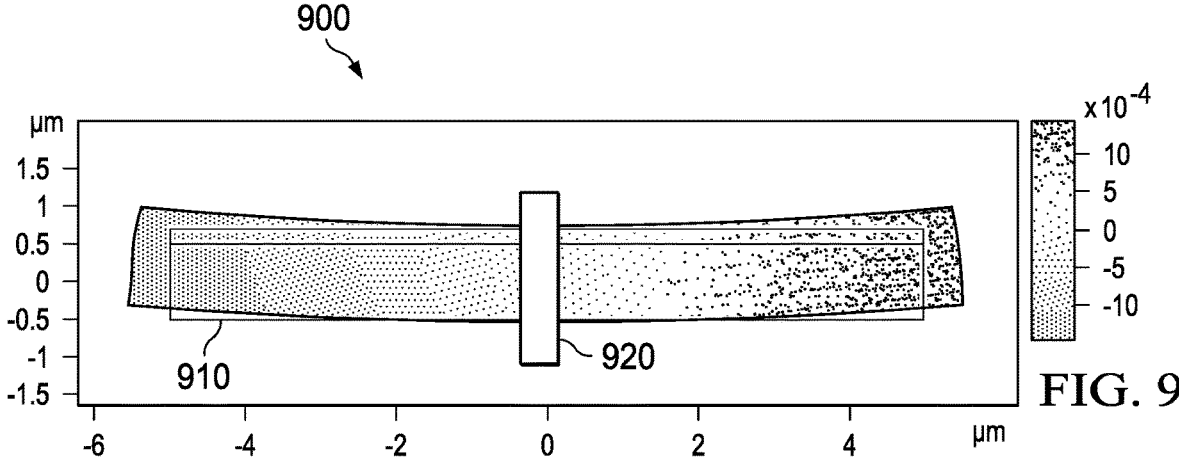
FIG. 9 is a diagram of a cross section of a sensor unit anchored at two opposite sides, in accordance with various examples.

FIG. 9 is a diagram of a cross section 900 of a sensor unit 910 anchored at two opposite sides, in accordance with various examples. In FIG. 9, the x-axis represents a length or width of the sensor unit 910 in μm, and the y-axis represents the depth or thickness in μm. The sensor unit 910 may have a rectangle or square or other surface geometry with four sides and may be anchored by two contacts 920 coupled to two opposite sides of the four sides. The cross section 900 shows one of the contacts 920 on one side of the sensor unit 910. For example, the sensor unit 910 may be any of the reference sensor unit 610, first sensor unit 620, or second sensor unit 630 in the optical device 600 that is anchored through two corresponding contacts 691, 692, or 693 to the surrounding surfaces 642, 644 on the substrate 650. FIG. 9 shows a bending in the sensor unit 910 responsive to a deformation across the piezoelectric and dielectric layers that form the sensor unit 910. The contracting and expanding movement of the piezoelectric layer may be responsive to absorbing a time modulated incident light on the sensor unit 910.

Figure 10:
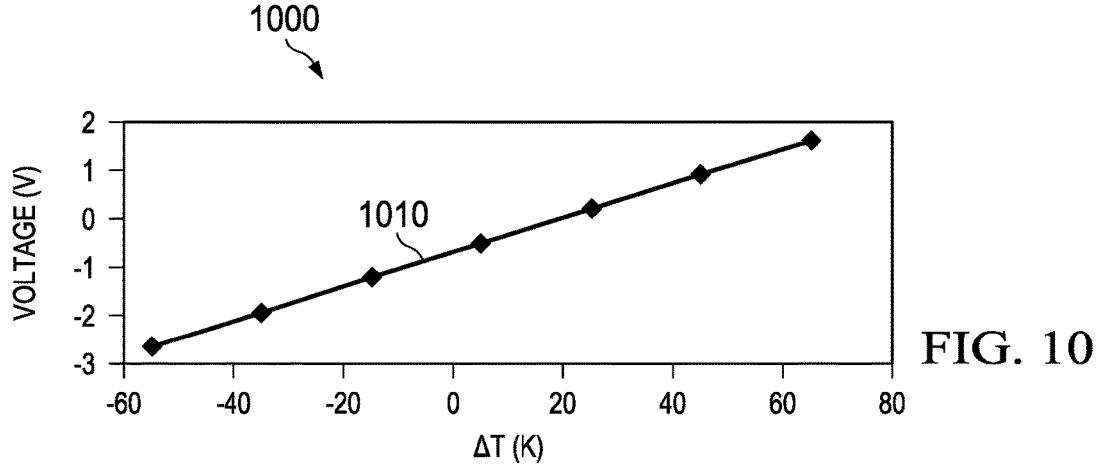
FIG. 10 is a graph of voltage to temperature sensitivity of the sensor unit of FIG. 9, in accordance with various examples.

FIG. 10 is a graph 1000 of voltage to temperature sensitivity of the sensor unit 910 of FIG. 9, in accordance with various examples. In the graph 1000, the x-axis represents a measured voltage in units of V and the y-axis represents the detectable temperature change (ΔT) in kelvin (K). The voltage-to-temperature sensitivity of the sensor unit 910 is represented by a curve 1010 that relates V to ΔT for the piezoelectric layer of the sensor unit 910. ΔT may be proportional to the absorbed light energy in the sensor unit 910. The slope of the curve 1010 may be useful as a metric for quantifying the voltage-to-temperature sensitivity of the piezoelectric layer in the sensor unit 910.

Figure 11:
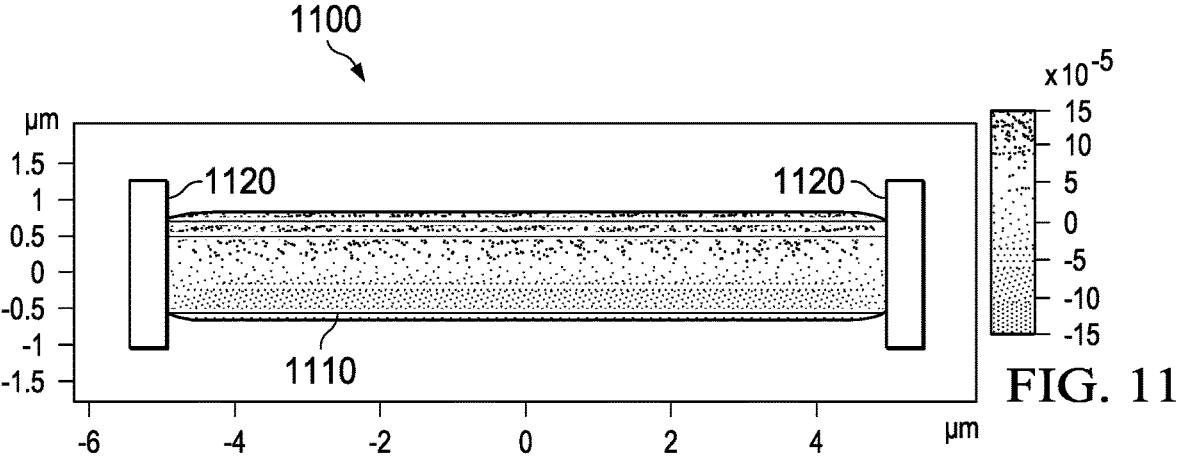
FIG. 11 is a diagram of a cross section of a sensor unit anchored at four sides, in accordance with various examples.

FIG. 11 is a diagram of a cross section 1100 of a sensor unit 1110 anchored at four sides, in accordance with various examples. In FIG. 11, the x-axis represents a length or width of the sensor unit 1110 in μm and the y-axis represents the depth or thickness in μm. The sensor unit 1110 may have a rectangle or square or other surface geometry with four sides and may be anchored by four contacts 1120 coupled to the four sides. The cross section 1100 shows two of the four contacts 1120 on two opposite sides of the sensor unit 1110. In various examples, the sensor unit 1110 may be any of the reference sensor unit 710, first sensor unit 720, or second sensor unit 730 of the optical device 700 that is anchored through four corresponding contacts 791, 792, or 793 to the surrounding surfaces 742, 743 on the substrate 744. FIG. 11 shows thickness expansion in the sensor unit 1110 responsive to absorbing the light energy. In comparison to the sensor unit 910 that is anchored with two contacts 920 on two opposite sides, the sensor unit 1110 may exhibit reduced bending responsive to absorbing the light energy, and thus provide more stability, as a result of its anchoring with the four contacts 1120 on the four sides of the sensor unit 1110.

Figure 12:
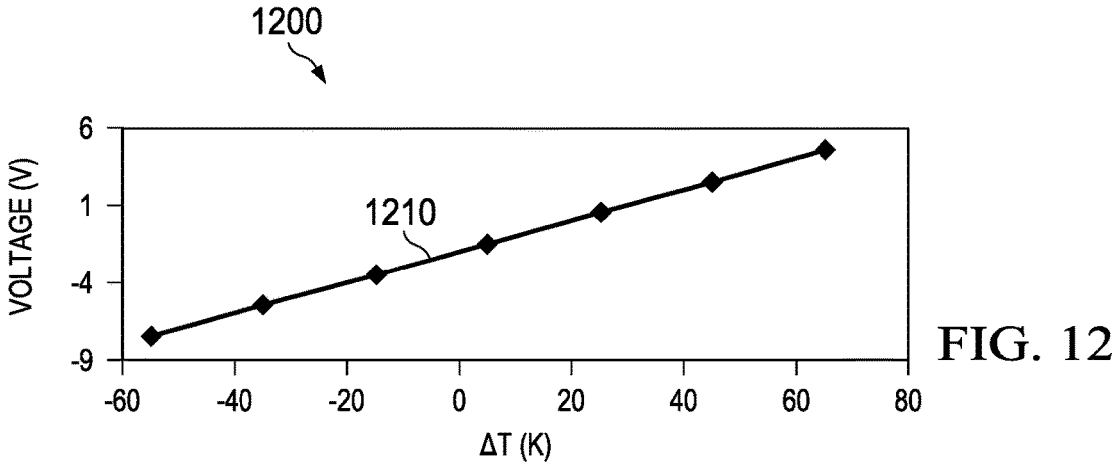
FIG. 12 is a graph of voltage to temperature sensitivity of the sensor unit of FIG. 11, in accordance with various examples.

FIG. 12 is a graph 1200 of voltage to temperature sensitivity of the sensor unit 1110 of FIG. 11, in accordance with various examples. In the graph 1200, the x-axis represents a measured voltage in units of V, and the y-axis represents ΔT in K. The voltage-to-temperature sensitivity of the sensor unit 1110 is represented by a curve 1210 that relates V to ΔT for the sensor unit 1110. ΔT may be proportional to the absorbed light energy in the sensor unit 1110. The slope of the curve 1210 may be useful as a metric for quantifying the voltage-to-temperature sensitivity of the sensor unit 1110. In comparison to the curve 1010 for the sensor unit 910, the curve 1210 for the sensor unit 1110 shows increased voltage-to-temperature sensitivity responsive to the increase in number of contacts 1120 for anchoring and resultant thickness expansion of the sensor unit 1110. The increased number of contacts 1120 for anchoring the sensor unit 1110 may increase thermal coupling and reduce thermal isolation with the surrounding layers.

Figure 13:
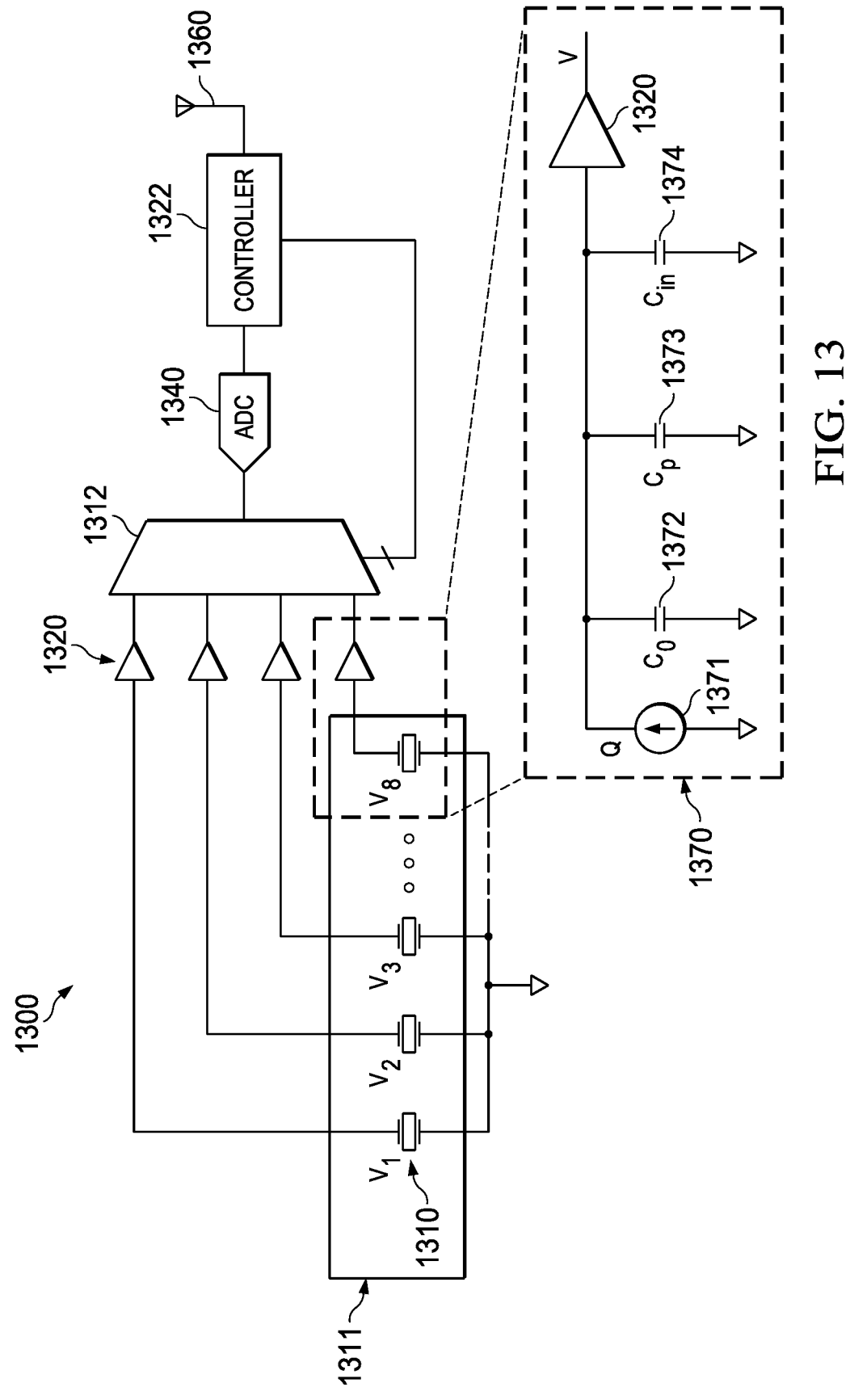
FIG. 13 is a circuit diagram of an optical detector system including multiple sensor units, in accordance with various examples.

FIG. 13 is a circuit diagram of an optical detector system 1300 including multiple sensor units 1310, in accordance with various examples. The multiple sensor units 1310 may be combined in an optical device 1311 of the optical detector system 1300. The optical device 1311 may be enabled to absorb and detect an incident light beam, such as for characterizing one or more samples, in accordance with the examples described above. For example, the optical detector system 1300 may be part of or correspond to the optical detector 120 in the light detector system 100. The optical detector system 1300 may include a multiplexer 1312 (MUX) coupled to the multiple sensor units 1310 through respective transimpedance amplifiers 1320, a controller 1322 coupled to the multiplexer 1312 through an analog-to-digital converter (ADC) 1340 and an antenna 1360 coupled to the controller 1322.

Each sensor unit 1310 may absorb incident light on the surface of the optical device 1311 in the optical detector system 1300 within a frequency or wavelength range, as described in the examples above. For example, the sensor unit 1310 may be one of the reference sensor unit 610, first sensor unit 620, or second sensor unit 630 in the optical device 600, or one of the reference sensor unit 710, first sensor unit 720, or second sensor unit 730 in the optical device 700. Each sensor unit 1310 may include a plasmonic metasurface, a piezoelectric layer, and one or more metal layers coupled to the piezoelectric layer.

The transimpedance amplifier 1320 may provide high-to-low impedance transformation to maintain or amplify the voltage level collected from the respective sensor unit 1310 to a voltage level detectable by other components of the optical detector system 1300. The combination of the transimpedance amplifier 1320 and the respective sensor unit 1310 may model an amplifier circuit 1370 with multiple capacitance sources. For example, the modeled amplifier circuit 1370 may include a current source 1371 representing the current flow from the sensor unit 1310, a first capacitor 1372 representing sensor unit intrinsic capacitance, a second capacitor 1373 representing parasitic capacitance, and a third capacitor 1374 representing the input capacitance of the transimpedance amplifier 1310. To maintain or increase the measured voltage level from the transimpedance amplifier 1320, the capacitances of the second capacitor 1373 and third capacitor 1374 may be substantially smaller than the capacitance of the first capacitor 1372 in the modeled amplifier circuit 1370.

The multiplexer 1312 may collect the amplified voltage levels from the respective sensor units 1310 via the respective transimpedance amplifiers 1320, multiplex the voltage signals in a time sequence and send the signals as an analog electric signal to the ADC 1340. The ADC 1340 may convert the analog electric signal from the multiplexer 1312 into a digital signal that can be processed by the controller 1322. The controller 1322 may receive and process the signal to detect the amplitude of absorbed light in the sensor units 1310 and determine the characteristics of the one or more samples. The controller 1322 may determine which sensor unit 1310 will be read at each time by selecting the corresponding input in the multiplexer 1312 and may provide time modulation of the light source 110. The antenna 1360 may establish wireless connections to enable the controller 1322 to send or receive signals. For example, the optical detector system 1300 may be a stand-alone or mountable device that detects light, measures a resulting voltage, characterizes a sample accordingly, and sends the data in a wireless connection to a central device or system (not shown). In other examples, the optical detector system 1300 may detect light, measure a resulting voltage, and send this information to another device or system (not shown) for analysis.

Figure 14:
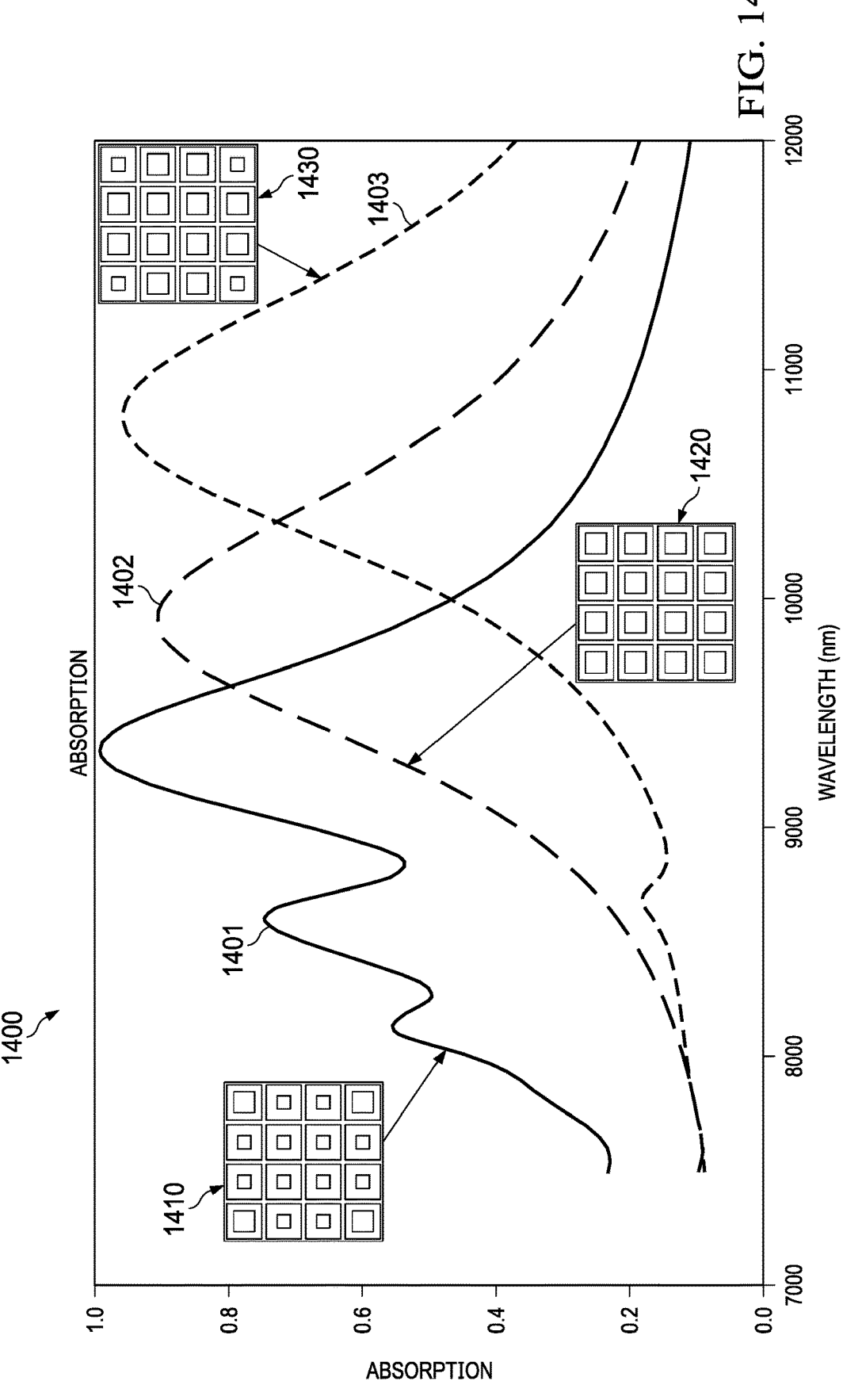
FIG. 14 is a graph of multiple light absorption profiles for an optical device including multiple sensor units, in accordance with various examples.

FIG. 14 is a graph 1400 of multiple light absorption profiles for an optical device including multiple sensor units, in accordance with various examples. In the graph 1400, the x-axis represents a range of wavelengths of the incident light in nanometers (nm) and the y-axis represents the absorption values of incident light. The absorption values reflect the amplitude of the absorbed light at the multiple sensor units of the optical device as a percentage. The wavelength range is between approximately 7000 and 12000 nm, which corresponds to the IR spectrum for a broadband light source. The graph 1400 shows the light absorption profiles represented by curves 1401, 1402, and 1403 for three respective sensor units 1410, 1420, and 1430, which may be combined in an optical detector. For example, the sensor units 1410, 1420, and 1430 may be combined in the optical detector 120 of the light detector system 100 or in the optical detector system 1300. The sensor units 1410, 1420, and 1430 may be configured similar to the reference sensor unit 610, the first sensor unit 620, and the second sensor unit 630, respectively, in the optical device 600 or the reference sensor unit 710, the first sensor unit 720, and the second sensor unit 730, respectively, in the optical device 700. Each sensor unit 1410, 1420, and 1430 includes a plasmonic metasurface designed to absorb light at a certain resonance frequency or wavelength.

The curves 1401, 1402, and 1403 represent the resonance responses for the sensor units 1410, 1420, and 1430, respectively. The curves 1401, 1402, and 1403 show percentages of the absorbed light at the plasmonic metasurfaces of the sensor units 1410, 1420, and 1430 in the IR wavelength range of the broadband light source. The resonance responses of the sensor units 1410, 1420, and 1430 include three resonance wavelengths at approximately 9300 nm, 9900 nm, and 10800 nm, respectively. By integrating the three sensor units 1410, 1420, and 1430 in the optical device, the resonance response, and therefore the detection capability of the optical detection system, can be increased to multiple types of samples over a broadband spectrum.

FIG. 15 is a flow diagram of a method 1500 for light detection in an optical device, in accordance with various examples. The optical device may include a plasmonic metasurface, a piezoelectric layer, and one or more metal layers coupled to the piezoelectric layer. For example, the method 1500 may be performed by a light detector system such as the light detector system 100 or the optical detector system 1300. The light detector system may include an optical device such as the optical devices 300, 600, or 700, or another optical device designed in accordance with the optical devices described above. At step 1501, a light source having a frequency spectrum may be modulated in time. For example, the frequency spectrum of the emitted light may be an IR spectrum or a visible light spectrum. At step 1502, one or more plasmonic metasurfaces of a light detector system may absorb, at one or more respective resonance wavelengths of the plasmonic metasurfaces, the light emitted by the light source that strikes the plasmonic metasurfaces as incident light. The one or more plasmonic metasurfaces may correspond to one or more sensor units in the optical device and may each absorb a portion of the incident light within a corresponding resonance wavelength range. At step 1503, an amplitude of a voltage across a piezoelectric layer of the light detector may be measured. The measured voltage may be modulated in time in accordance with the modulated incident light on the optical device. The piezoelectric layer may be coupled to the one or more plasmonic metasurfaces and may convert the energy of the absorbed light into a measurable voltage. The voltage may be measured in one or more sensor units with a time multiplexing scheme. At step 1504, an amplitude of the voltage, and accordingly a corresponding change in the intensity of the incident light, may be determined. The light intensity may be determined based on the amplitude and analyzed by a microprocessor or a processing system to infer characteristics of one or more samples exposed to the light beam after emission by the light source and before absorption of light by the optical device.

FIG. 16 is a block diagram of a hardware architecture 1600 of a processing system, in accordance with various examples. The hardware architecture 1600 includes hardware components that may be part of the processing system. For example, the hardware architecture 1600 may correspond to the processing system 150 in the light detector system 100. As shown in FIG. 16, the hardware architecture 1600 may include one or more processors 1601 and one or more memories 1602. In some examples, the hardware architecture 1600 may also include one or more transceivers 1603 and one or more antennas 1604 for establishing wireless connections. These components may be connected through a bus 1605 or in any other suitable manner. In FIG. 16, an example in which the components are connected through a bus 1605 is shown.

The processor 1601 may be configured to read and execute computer-readable instructions. For example, the processor 1601 may be configured to invoke and execute instructions stored in the memory 1602, including the instructions 1606. The processor 1601 may support one or more global systems for wireless communication. Responsive to the processor 1601 sending a message or data, the processor 1601 drives or controls the transceiver 1603 to perform the sending. The processor 1601 also drives or controls the transceiver 1603 to perform receiving, responsive to the processor 1601 receiving a message or data. Therefore, the processor 1601 may be considered as a control center for performing sending or receiving, and the transceiver 1603 is an executor for performing the sending and receiving operations.

In an example, the memory 1602 may be coupled to the processor 1601 through the bus 1605 or an input/output port.

In another example, the memory 1602 may be integrated with the processor 1601. The memory 1602 is configured to store various software programs and/or multiple groups of instructions, including instructions 1606. For example, the memory 1602 may include a high-speed random-access memory and may include a nonvolatile memory such as one or more disk storage devices, a flash memory, or another nonvolatile solid-state storage device. The memory 1602 may store an operating system such as ANDROID, IOS, WINDOWS, or LINUX. The memory 1602 may further store a network communications program. The network communications program is useful for communication with one or more attached devices, one or more user equipment, or one or more network devices, for example. The memory 1602 may further store a user interface program. The user interface program may display content of an application through a graphical interface, and receive a control operation performed by a user on the application via an input control such as a menu, a dialog box, or a physical input device (not shown). The memory 1602 may be configured to store the instructions 1606 for implementing the various methods and processes provided in accordance with the various examples of this application.

The antenna 1604 may be configured to convert electromagnetic energy into an electromagnetic wave in free space or convert an electromagnetic wave in free space into electromagnetic energy in a transmission line. The transceiver 1603 may be configured to transmit a signal that is provided by the processor 1601 or may be configured to receive a wireless communications signal received by the antenna 1604. In this example, the transceiver 1603 may be considered a wireless transceiver.

The hardware architecture 1600 may also include another communications component such as a Global Positioning System (GPS) module, a BLUETOOTH module, or a WI-FI module. The hardware architecture 1600 may also support another wireless communications signal such as a satellite signal or a short-wave signal. The hardware architecture 1600 may also be provided with a wired network interface or a local area network (LAN) interface to support wired communication.

In accordance with various examples, the hardware architecture 1600 may further include an input/output device (not shown), such as an audio input/output device, a key input device, a display, and the like. The input/output device may be configured to implement interaction between the hardware architecture 1600 and a user/an external environment, and may include the audio input/output device, the key input device, the display, and the like. The input/output device may further include a camera, a touchscreen, a sensor, and the like. The input/output device may communicate with the processor 1601 through a user interface.

The hardware architecture 1600 shown in FIG. 16 is a possible implementation in various examples of this application. During actual application, the hardware architecture 1600 may include more or fewer components. This is not limited herein.

The term "couple" is used throughout the specification. The term may cover connections, communications or signal paths that enable a functional relationship consistent with this description. For example, if device A provides a signal to control device B to perform an action, in a first example device A is coupled to device B or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through a construction and/or layout of hardware components and interconnections of the device, or a combination thereof.

A device that is described herein as including certain components may instead be adapted to be coupled to those components to form the described device. For example, a structure described as including one or more elements (such as structures or layers) and/or one or more sources (such as voltage and/or current sources) may instead include only the elements within a single physical device (e.g., the structures and layers in the device) and may be adapted to be coupled to at least some of the sources to form the described structure or system either at a time of manufacture or after a time of manufacture, such as by an end-user and/or a third-party.

While certain components may be described herein as being of a particular process technology, these components may be exchanged for components of other process technologies. Structures and designs described herein are reconfigurable to include the replaced components to provide functionality at least partially similar to functionality available prior to the component replacement.

Unless otherwise stated, "about," "approximately," or "substantially" preceding a value means+/−10 percent of the stated value. Modifications are possible in the described examples, and other examples are possible within the scope of the claims.

What is claimed is:

1. An apparatus, comprising:
   a first metal layer;
   a piezoelectric layer on the first metal layer;
   a second metal layer on the piezoelectric layer;
   an optical structure on the second metal layer; and
   a circuit coupled to the first metal layer and the second metal layer and configurable to provide a first signal indicative of an intensity of an optical signal incident on the optical structure responsive to sensing a second signal provided by the piezoelectric layer.

2. The apparatus of claim 1, wherein the optical structure includes a plasmonic metasurface.

3. The apparatus of claim 1, further comprising:
   a substrate having a cavity, the optical structure and at least part of the piezoelectric layer being over the cavity; and
   a first anchor structure and a second anchor structure coupled between the substrate and opposite sides of the optical structure.

4. The apparatus of claim 3, wherein the opposite sides are first opposite sides, and the apparatus further comprises a third anchor structure and a fourth anchor structure on second opposite sides of the optical structure, wherein the first, second, third, and fourth anchor structures are on four different sides of the optical structure.

5. The apparatus of claim 2, wherein the plasmonic metasurface includes metal patches that are equally spaced in a two-dimensional grid formation, and wherein a size and a spacing of the metal patches are based on a frequency range of light to be absorbed by the plasmonic metasurface.

6. The apparatus of claim 1, wherein the piezoelectric layer includes aluminum nitride.

7. The apparatus of claim 3, wherein at least part of the optical structure is spaced from the substrate.

8. The apparatus of claim 1, wherein the optical structure is a first optical structure having a first optical property, and the apparatus further comprises a second optical structure having a second optical property on the second metal layer.

9. The apparatus of claim 1, wherein the optical structure is configurable to absorb the optical signal having a particular wavelength.

10. An apparatus, comprising:

an optical structure configurable to absorb light of a particular wavelength range;

a piezoelectric layer deformable to generate a first signal representing an electric field across the piezoelectric layer responsive to the optical structure absorbing the light of the particular wavelength range; and a circuit coupled to the piezoelectric layer and configurable to generate a second signal responsive to the first signal.

11. The apparatus of claim 10, wherein the particular wavelength range is an infrared wavelength range.

12. The apparatus of claim 10, further comprising a temperature sensor coupled to the circuit, the temperature sensor configurable to provide a third signal indicative of a temperature of the piezoelectric layer.

13. The apparatus of claim 12, wherein the circuit is configurable to provide the second signal indicative of an intensity of the light of the particular wavelength range responsive to the first and third signals.

14. A system, comprising:

a light source configurable to emit light; and an optical detector configurable to detect an intensity of the light at a wavelength range, wherein the optical detector comprises:

an optical structure configurable to absorb the light at the wavelength range and generate thermal energy responsive to absorbing the light; and a thermal sensor including a material deformable responsive to the thermal energy, wherein the thermal sensor is configurable to provide a signal indicative of a degree of deformation of the material to represent an amplitude of the light.

15. The system of claim 14, further comprising a chamber between the light source and the optical detector, the chamber configurable to contain a gas or a fluid and to allow the light to propagate through the chamber from the light source to the optical detector.

16. The system of claim 14, wherein the optical structure includes a plasmonic metasurface, and the thermal sensor includes a piezoelectric layer.

17. The system of claim 16, wherein the plasmonic metasurface is a first plasmonic metasurface, the wavelength range is a first wavelength range, and the system further comprises a second plasmonic metasurface configurable to absorb light at a second wavelength range.

18. The system of claim 17, wherein the first plasmonic metasurface includes first metal patches equally spaced in a first two-dimensional grid formation and having a first size and a first spacing, and wherein the second plasmonic metasurface includes second metal patches equally spaced in a second two-dimensional grid formation and having a second size and a second spacing.

19. The system of claim 18, wherein the optical structure includes a reference detection layer, the reference detection layer including a continuous metal layer.

20. The system of claim 19, wherein the thermal sensor includes:

a multiplexer coupled to the reference detection layer, the first plasmonic metasurface, and the second plasmonic metasurface through respective amplifier circuits; and an analog-to-digital converter (ADC) coupled to the multiplexer.

21. The system of claim 20, wherein the thermal sensor includes a first transimpedance amplifier coupled to the reference detection layer, a second transimpedance amplifier coupled to the first plasmonic metasurface, and a third transimpedance amplifier coupled to the second plasmonic metasurface.

\*    \*    \*    \*    \*